United States Patent
Sangolli et al.

(10) Patent No.: US 8,975,921 B1
(45) Date of Patent: Mar. 10, 2015

(54) SYNCHRONOUS CLOCK MULTIPLEXER

(71) Applicants: Ramesh M. Sangolli, Navanagar Hubli (IN); Sanjay J. Arya, Delhi (IN); Deepika Chandra, Noida (IN)

(72) Inventors: Ramesh M. Sangolli, Navanagar Hubli (IN); Sanjay J. Arya, Delhi (IN); Deepika Chandra, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/100,035

(22) Filed: Dec. 9, 2013

(51) Int. Cl.
| | |
|---|---|
| H03K 19/00 | (2006.01) |
| H03K 19/003 | (2006.01) |
| H03K 19/08 | (2006.01) |
| H03K 19/20 | (2006.01) |

(52) U.S. Cl.
CPC .............. *H03K 19/003* (2013.01); *H03K 19/08* (2013.01); *H03K 19/20* (2013.01)
USPC .................................. 326/93; 326/46; 326/96

(58) Field of Classification Search
USPC .......................................... 326/46, 47, 93–98
See application file for complete search history.

(56) References Cited

U.S. PATENT DOCUMENTS

| | | | | |
|---|---|---|---|---|
| 4,754,456 | A * | 6/1988 | Yato et al. | 370/541 |
| 4,965,524 | A | 10/1990 | Patchen | |
| 5,357,146 | A * | 10/1994 | Heimann | 327/292 |
| 5,877,636 | A | 3/1999 | Truong | |
| 6,784,699 | B2 * | 8/2004 | Haroun et al. | 327/99 |
| 7,679,408 | B2 | 3/2010 | Hailu | |
| 7,911,239 | B2 | 3/2011 | Saint-Laurent | |
| 8,054,103 | B1 | 11/2011 | Janardhanan | |
| 2006/0098770 | A1 * | 5/2006 | Harper et al. | 375/356 |
| 2014/0320170 | A1 * | 10/2014 | Rooks | 326/93 |

* cited by examiner

*Primary Examiner* — Don Le
(74) *Attorney, Agent, or Firm* — Charles Bergere

(57) ABSTRACT

A synchronous clock multiplexer circuit detects the presence of an input clock signal whenever an input select signal changes state to select the input clock signal, and generates an output select signal, which is then used instead of the input select signal for selecting an input clock signal as an output clock signal. The output select signal stays in a logic high state to select a second input clock signal when the input select signal transitions from high to low to select a first input clock signal but the first input clock signal is not present. The output select signal stays in a logic low state to select the first input clock signal when the input select signal transitions from low to high to select the second input clock signal but the second input clock signal is not present.

10 Claims, 5 Drawing Sheets

SYNCHRONOUS CLOCK MULTIPLEXER

BACKGROUND OF THE INVENTION

The present invention relates generally to digital circuits, and more particularly, to a synchronous clock multiplexer.

Integrated circuits include circuit modules that perform various tasks and operate in tandem. Examples of circuit modules include processors, logic gates, flip-flops, latches, system buses, and so forth. These circuit modules are driven by clock signals. Depending on the system requirements, different circuit modules may require different clock signals (of different phases and frequencies) for their operation; e.g., an integrated circuit may include one set of modules that operates in a first clock domain and another set of modules that operates in a second clock domain. Such integrated circuits are referred to as asynchronous integrated circuits.

A clock multiplexer is used to provide clock signals from different clock sources to the circuit modules. FIG. 1 is a schematic block diagram of a synchronous clock multiplexer 100. The synchronous clock multiplexer 100 has two input terminals for receiving first and second clock input signals CLK0 and CLK1, a select terminal for receiving a select signal SELECT and an output terminal for providing either of the first and second clock signals CLK0 and CLK1 as an output clock signal OUT CLOCK. The synchronous clock multiplexer 100 provides the first clock input signal CLK0 as the output clock signal OUT CLOCK signal when the select signal SELECT is low and provides the second input clock signal CLK1 as the output clock signal OUT CLOCK when the select signal SELECT is high. The synchronous clock multiplexer 100 synchronously provides one of the first and second clock input signals when the select signal SELECT transitions from low to high state, or vice-versa.

However, on certain occasions, when the select signal SELECT transitions from high to low, the first clock input signal CLK0 may not be available at the input terminal, or when select signal SELECT transitions from low to high, the second clock input signal CLK1 may not be available at the input terminal due to, for example, an error in corresponding clock sources. In such cases, the synchronous clock multiplexer 100 generates an undesired clock signal or does not generate the clock signal, leading to erroneous operation of the circuit modules and the integrated circuit.

Therefore, it would be advantageous to have a synchronous clock multiplexer circuit that detects the presence of clock input signals at its input terminals when the select signal is transitioning, generates an output clock signal based on the presence of a clock input signal, and does not generate an erroneous output when a selected clock signal is not available.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
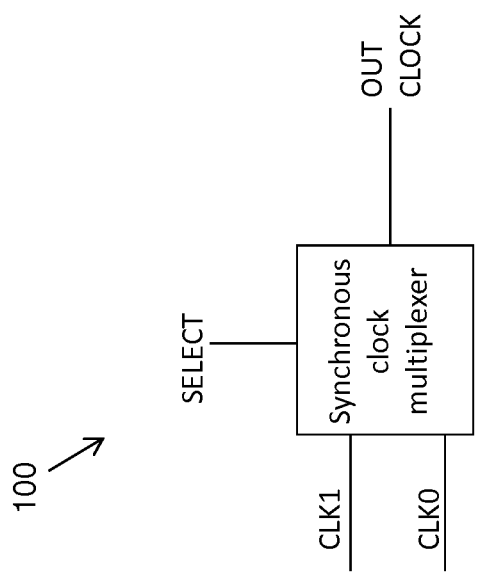
FIG. 1 is a schematic block diagram of a conventional synchronous clock multiplexer.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a synchronous clock multiplexer circuit is provided. The circuit includes a first flip-flop having an input terminal that receives an input select signal, a clock terminal that receives a first clock signal. A second flip-flop has an input terminal for receiving the input select signal, and a clock terminal for receiving a second clock signal. A first OR gate has a first input terminal connected to an output terminal of the first flip-flop, a second input terminal connected to an output terminal of the second flip-flop, and an output terminal for generating a first output signal. A first AND gate has a first input terminal connected to the output terminal of the first flip-flop, a second input terminal connected to the output terminal of the second flip-flop, and an output terminal for generating a second output signal. A first logic circuit receives the input select signal and the second output signal, and generates a third output signal. A second logic circuit receives the input select signal and the first output signal, and generates a fourth output signal. A second AND gate receives the first and third output signals, and generates a fifth output signal. A second OR gate receives the second and fourth output signals, and generates a sixth output signal. A multiplexer has a first input terminal connected to the second AND gate for receiving the fifth output signal, a second input terminal connected to the second OR gate for receiving the sixth output signal, a select terminal for receiving a delayed first input select signal, and an output terminal for generating an output select signal. A synchronous clock multiplexer has a first input terminal for receiving the first clock signal, a second input terminal for receiving the second clock signal, a select terminal connected to the output terminal of the multiplexer for receiving the output select signal, and an output terminal for outputting one of the first and second clock signals.

In another embodiment of the present invention, a synchronous clock multiplexer circuit includes a first flip-flop having an input terminal for receiving an input select signal, and a clock terminal for receiving a first clock signal. A second flip-flop has an input terminal for receiving the input select signal, and a clock terminal for receiving a second clock signal. A first OR gate has a first input terminal connected to an output terminal of the first flip-flop, a second input terminal connected to an output terminal of the second flip-flop, and an output terminal for generating a first output signal. A first AND gate has a first input terminal connected to the output terminal of the first flip-flop, a second input terminal connected to the output terminal of the second flip-flop, and an output terminal for generating a second output signal. A second AND gate has a first input terminal for receiving an inverted second output signal, and a second input terminal for receiving a delayed first input select signal. A third flip-flop has an input terminal connected to an output of the second AND gate for receiving an inverted output of the second AND gate, and a clock terminal for receiving the inverted input select signal. The third flip-flop outputs a third output signal at an output terminal thereof when the input select signal transitions from a logic high state to a logic low state. A third AND gate receives the first and third output signals, and generates a fifth output signal. A fourth AND gate has a first input terminal for receiving the first output signal, and an inverted second input terminal for receiving the delayed first input select signal. A fourth flip-flop has an input terminal connected to an output of the fourth AND gate, and a clock terminal for receiving the input select signal. The fourth flip-flop outputs a fourth output signal at an output terminal thereof when the input select signal transitions from a logic low state to a logic high state. A second OR gate receives the second and fourth output signals, and generates a sixth output signal. A multiplexer has a first input terminal connected to the third AND gate for receiving the fifth output signal, a second input terminal connected to the second OR gate for receiving the sixth output signal, a select terminal for receiving a delayed second input select signal, and an output terminal for generating an output select signal. A synchronous clock multiplexer has a first input terminal for receiving the first clock signal, a second input terminal for receiving the second clock signal, a select terminal connected to the output terminal of the multiplexer for receiving the output select signal, and an output terminal for outputting one of the first and second clock signals.

Various embodiments of the present invention provide a synchronous clock multiplexing system for outputting first and second clock signals. The multiplexing system includes first and second synchronizers, a plurality of logic circuits, and a synchronous clock mux. The first and second synchronizers receive and output the input select signal based on the availability of the first and second clock signals. The logic circuits receive the output of the first and second synchronizers, and generate an output select signal. The synchronous clock mux selects one of the first and second clock signals as the output clock signal based on the output select signal. When the first clock signal is not available and the input select signal transitions from high to low to select the first clock signal, the output select signal stays high, which causes the synchronous clock mux to select the second clock input signal as the output clock signal. When the first clock signal is available and the input select signal is low, the output select signal transitions to low, which causes the synchronous clock mux to select the first clock signal as the output clock signal. Thus, the synchronous clock multiplexing system of the present invention generates the output clock signal based on availability of the first and second clock signals. The unselected clock signal source may be shut down until it is required, which saves power. Further, the synchronous clock multiplexer circuit is easy to implement, and re-usable across multiple products and technologies.

Figure 2:
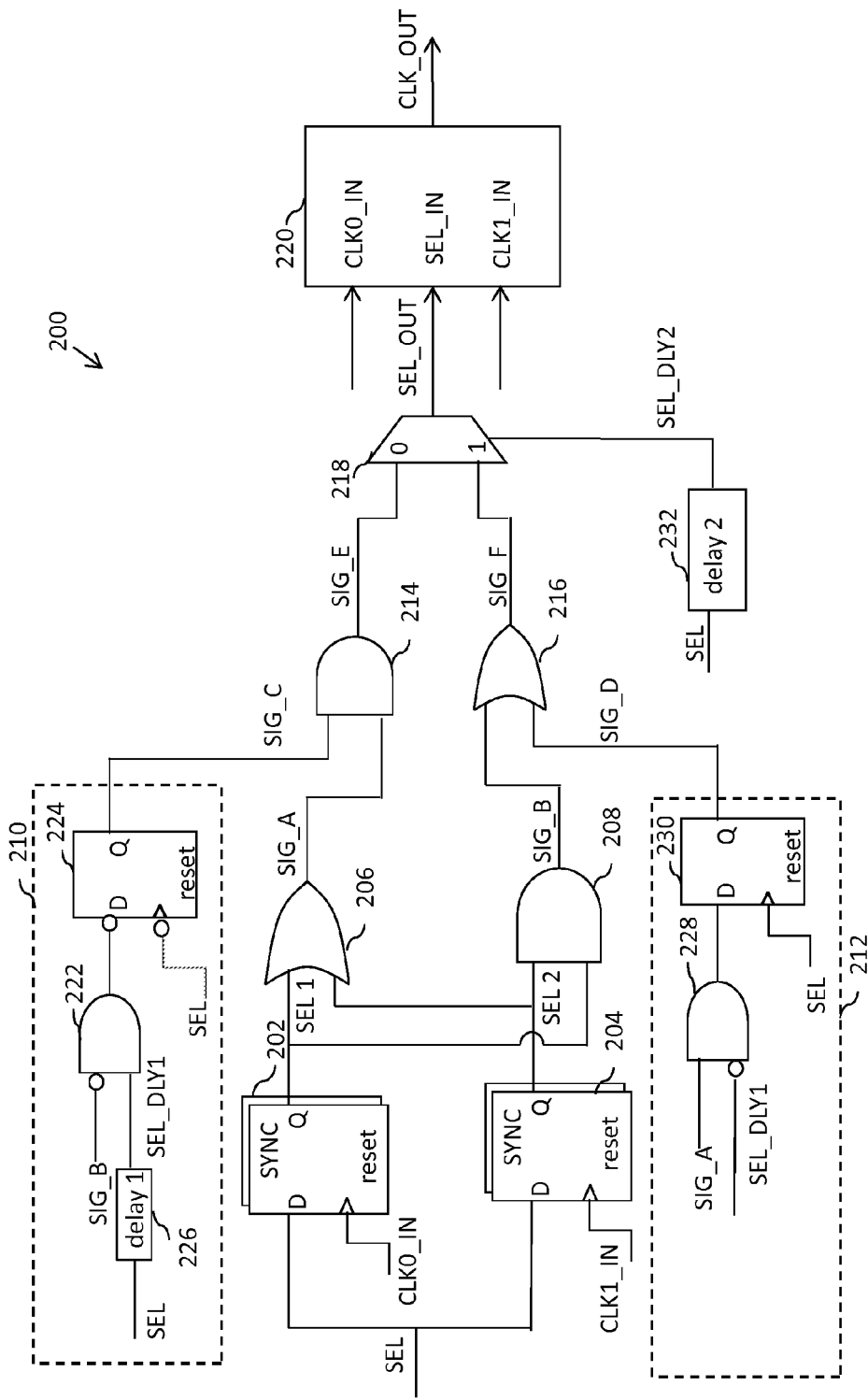
FIG. 2 is a schematic block diagram of a synchronous clock multiplexer circuit in accordance with an embodiment of the present invention.

Referring now to FIG. 2, a schematic block diagram of a synchronous clock multiplexing circuit 200 in accordance with an embodiment of the present invention is shown. The synchronous clock multiplexing circuit 200 includes first and second synchronizers 202 and 204, a first OR gate 206, a first AND gate 208, first and second logic circuits 210 and 212, a second AND gate 214, a second OR gate 216, a multiplexer or mux 218, and a synchronous clock mux 220.

In various embodiments of the present invention, the first and second synchronizers 202 and 204 each include a plurality of series-connected, positive edge-triggered D flip-flops.

In the embodiment shown, there are two clock signals, namely, a first clock signal CLK0_IN and a second clock signal CLK1_IN. There also is an input select signal SEL that is input to the circuit 200. The first and second clock signals CLK0_IN, CLK1_IN and the input select signal SEL are asynchronous in nature. Although, two clock signals CLK0_IN and CLK_IN are shown, it will be apparent to one of skill in the art that the synchronous clock multiplexing circuit 200 may be designed to receive more than two clock signals.

The first synchronizer 202, which in the embodiment shown comprises a D flip-flop, has a data input terminal that receives the input select signal SEL, a clock terminal that receives the first clock signal CLK0_IN, and an output terminal that outputs a first select signal SEL_1. The second synchronizer 204 also has a data input terminal that receives the input select signal SEL, a clock terminal that receives the second clock signal CLK1_IN, and an output terminal that outputs a second select signal SEL_2.

The first OR gate 206 has first and second input terminals connected to the output terminals of the first and second synchronizers 202 and 204 for receiving the first and second select signals SEL_1 and SEL_2, and an output terminal for generating a first output signal SIG_A. The first AND gate 208 has first and second input terminals connected to the output terminals of the first and second synchronizers 202 and 204 for receiving the first and second select signals SEL_1 and SEL_2, and an output terminal for generating a second output signal SIG_B.

The first logic circuit 210 includes a third AND gate 222 and a first flip-flop 224. The third AND gate 222 has a first input terminal that is inverted and receives the second output signal SIG_B; that is, the second output signal is provided to the first input terminal where it is inverted), and a second input terminal for receiving a delayed version (SEL_DLY1) of the input select signal SEL generated by a first delay element 226. The first flip-flop 224 has an inverted data input terminal connected to an output terminal of the third AND gate 222, an inverted clock terminal for receiving the input select signal SEL, and an output terminal for outputting a third output signal SIG_C.

In an embodiment of the present invention, the first delay element 226 delays the input select signal SEL by a first delay (delay_1) in order to prevent hold violations at the first flip-flop 224.

The second logic circuit 212 includes a fourth AND gate 228 and a second flip-flop 230. The fourth AND gate 228 has a first input terminal for receiving the first output signal SIG_A, and an inverted second input terminal for receiving the first delayed input select signal SEL_DLY1. The second flip-flop 230 has an input terminal connected to an output terminal of the fourth AND gate 228, a clock terminal for receiving the input select signal SEL, and an output terminal for outputting a fourth output signal SIG_D. The first delayed input select signal SEL_DLY1 is obtained by delaying the input select signal SEL by the first delay delay_1 to prevent hold violations at the second flip-flop 230.

The second AND gate 214 has a first input terminal for receiving the first output signal SIG_A, a second input terminal for receiving the third output signal SIG_C, and an output terminal for generating a fifth output signal SIG_E. The second OR gate 216 has a first input terminal for receiving the second output signal SIG_B, a second input terminal for receiving the fourth output signal SIG_D, and an output terminal for generating a sixth output signal SIG_F.

The mux 218 has a first input terminal connected to the output terminal of the second AND gate 214 for receiving the fifth output signal SIG_E, a second input terminal connected to the output terminal of the second OR gate 216 for receiving the sixth output signal SIG_F, a select terminal for receiving a second delayed input select signal SEL_DLY2 generated by a second delay element 232, and an output terminal for outputting an output select signal SEL_OUT. The second delay element 232 receives and delays the input select signal SEL by a second delay (delay_2) to generate the second delayed input select signal SEL_DY2, which prevents glitches at the mux 218 output. In one embodiment, the second delay delay_2 is greater than a sum of the first delay delay_1 and a propagation delay of the second OR gate 216 (or the second AND gate 214).

The synchronous clock mux 220 has first and second input terminals for receiving the first and second clock signals CLK0_IN and CLK1_IN, respectively, a select terminal connected to the output terminal of the mux 218 for receiving the output select signal SEL_OUT, and an output terminal for outputting one of the first and second clock signals CLK0_IN and CLK1_IN based on the output select signal SEL_OUT.

Figure 3A:
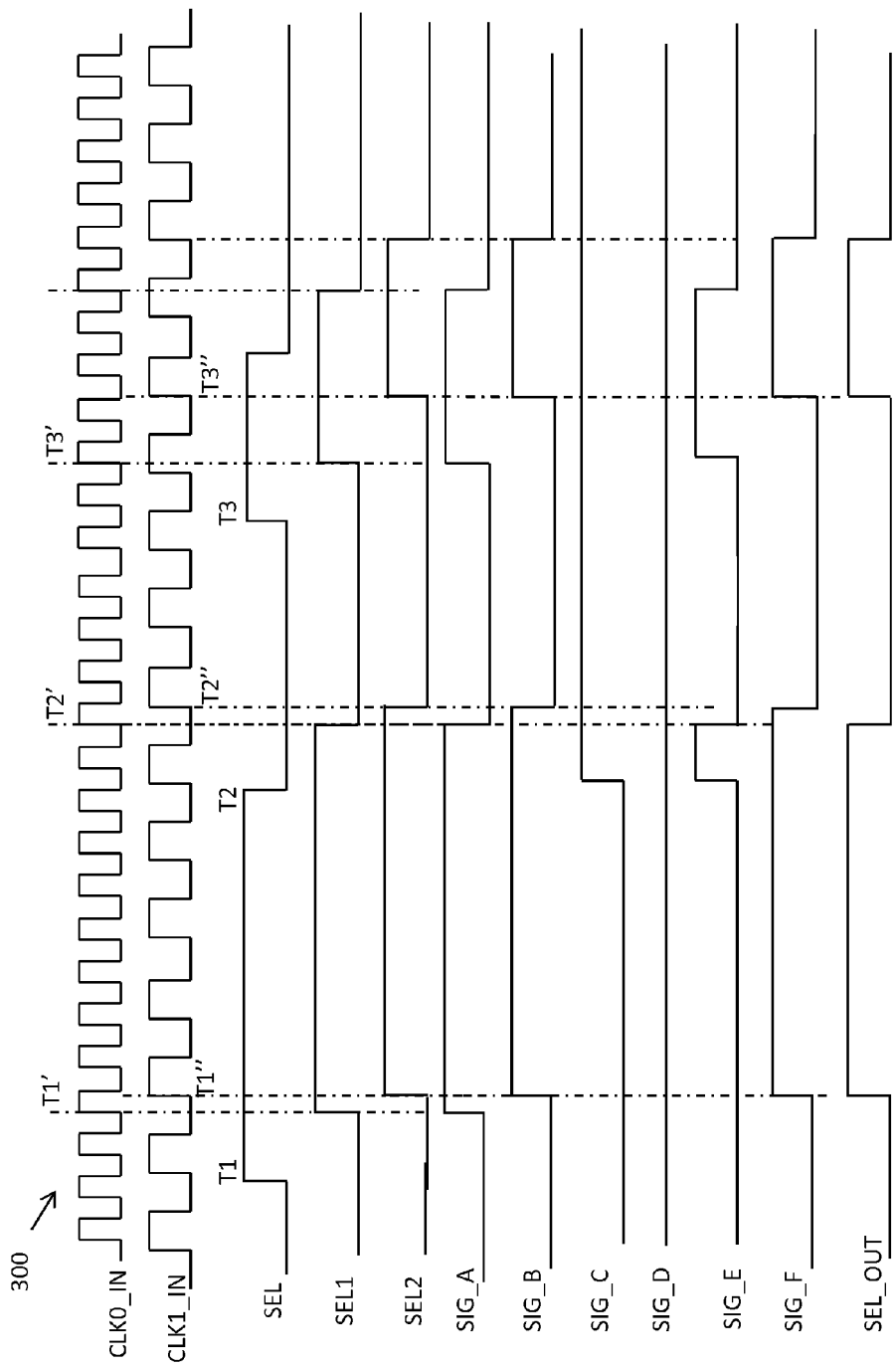
FIGS. 3A, 3B and 3C are timing diagrams illustrating first and second clock input signals, an input select signal and a plurality of output signals generated by the synchronous clock multiplexer circuit of FIG. 2, in accordance with various embodiments of the present invention.

FIG. 3A is a timing diagram 300 of the first and second clock signals CLK0_IN and CLK1_IN, the input select signal SEL, first and second select signals SEL_1 and SEL_2, the first through sixth output signals SIG_A, SIG_B, SIG_C, SIG_D, SIG_E, and SIG_F, and the output select signal SEL_OUT, when both the first and second clock signals CLK0_IN and CLK1_IN are available and operating correctly, in accordance with an embodiment of the present invention. For this example, the frequency of the first clock signal CLK0_IN is greater than that of the second clock signal CLK1_IN. Initially, the input select signal SEL, the first and second select signals SEL_1 and SEL_2, the first through sixth output signals SIG_A, SIG_B, SIG_C, SIG_D, SIG_E and SIG_F, and the output select signal SEL_OUT are assumed to be in a logic low state.

When the input select signal SEL transitions from low to high at time T1, the first and second synchronizers 202 and 204 each receive the input select signal SEL and output the input select signal SEL as first and second select signals SEL_1 and SEL_2, at times T1' and T1", respectively. In one embodiment of the invention, the first and second synchronizers 202 and 204 each include two series-connected, positive edge-triggered flip-flops, therefore, they output the input select signal SEL after two positive edges of the first and second clock signals CLK0_IN and CLK1_IN respectively. The first OR gate 206 and first AND gate 208 each receive the logic high first and second select signals SEL_1 and SEL_2 and generate the logic high first and second output signals SIG_A and SIG_B, at times T1' and T1", respectively. The output of the first flip-flop 224, i.e., the third output signal SIG_C stays in a logic low state, and the output of the second flip-flop 230, i.e., the fourth output signal SIG_D stays in a logic low state as the first output signal SIG_A is low at time T1. As a result, the output of the second AND gate 214, i.e., the fifth output signal SIG_E stays low and the output of the second OR gate 216, i.e., the sixth output signal SIG_F transitions from low to high as soon as the second output signal SIG_B transitions from low to high at time T1".

The mux 218 selects the sixth output signal SIG_F as the output select signal SEL_OUT at time T1. The output select signal SEL_OUT transitions from low to high at time T1" and the synchronous clock mux 220 selects the second clock signal CLK1_IN as the output clock signal CLK_OUT at time T1".

When the input select signal SEL transitions from high to low at time T2, the first and second synchronizers 202 and 204 output the first and second select signals SEL_1 and SEL_2 at times T2' and T2", respectively. The first OR gate 206 and first AND gate 208 each receive the logic low first and second select signals SEL_1 and SEL_2, and generate the logic low first and second output signals SIG_A and SIG_B, at times T2' and T2" respectively. The output of the first flip-flop 224, i.e., the third output signal SIG_C transitions from low to high at time T2, as the second output signal SIG_B is high at time T2, and the output of the second flip-flop 230, i.e., the fourth output signal SIG_D stays in the logic low state. As a result, the output of the second AND gate 214, i.e., the fifth output signal SIG_E transitions from low to high at time T2, but transitions back to low at time T2', as the first output signal SIG_A transitions to the logic low state at time T2'. Thus, the fifth output signal SIG_E stays in the logic high state from time T2 to T2'.

The mux 218 selects the fifth output signal SIG_E as the output select signal SEL_OUT at time T2. The output select signal SEL_OUT is in the logic high state at time T2 because the fifth output signal SIG_E is high, and hence, the synchronous clock mux 220 continues outputting the second clock signal CLK1_IN until time T2'. At time T2', the output select signal SEL_OUT transitions to the logic low state and hence, the synchronous clock mux 220 selects the first clock signal CLK0_IN as the output clock signal CLK_OUT.

When the input select signal SEL again transitions from low to high state at time T3, the first and second synchronizers 202 and 204 each receive the input select signal SEL and output the first and second select signals SEL_1 and SEL_2 at times T3' and T3", respectively. The first OR gate 206 and first AND gate 208 each receive the logic high first and second select signals SEL_1 and SEL_2 and generate logic high first and second output signals SIG_A and SIG_B, at times T3' and T3", respectively. The output of the first flip-flop 224, i.e., the third output signal SIG_C, stays high and the output of the second flip-flop 230, i.e., the fourth output signal SIG_D, stays low. As a result, the output of the second AND gate 214, i.e., the fifth output signal SIG_E transitions from low to high at time T3', and the output of the second OR gate 216, i.e., the sixth output signal SIG_F transitions from low to high at time T3". The mux 218 selects the sixth output signal SIG_F as the output select signal SEL_OUT at time T3. The output select signal SEL_OUT transitions from low to high at time T3", and hence the synchronous clock mux 220 selects the second clock signal CLK1_IN as the output clock signal CLK_OUT at time T3".

Figure 3B:
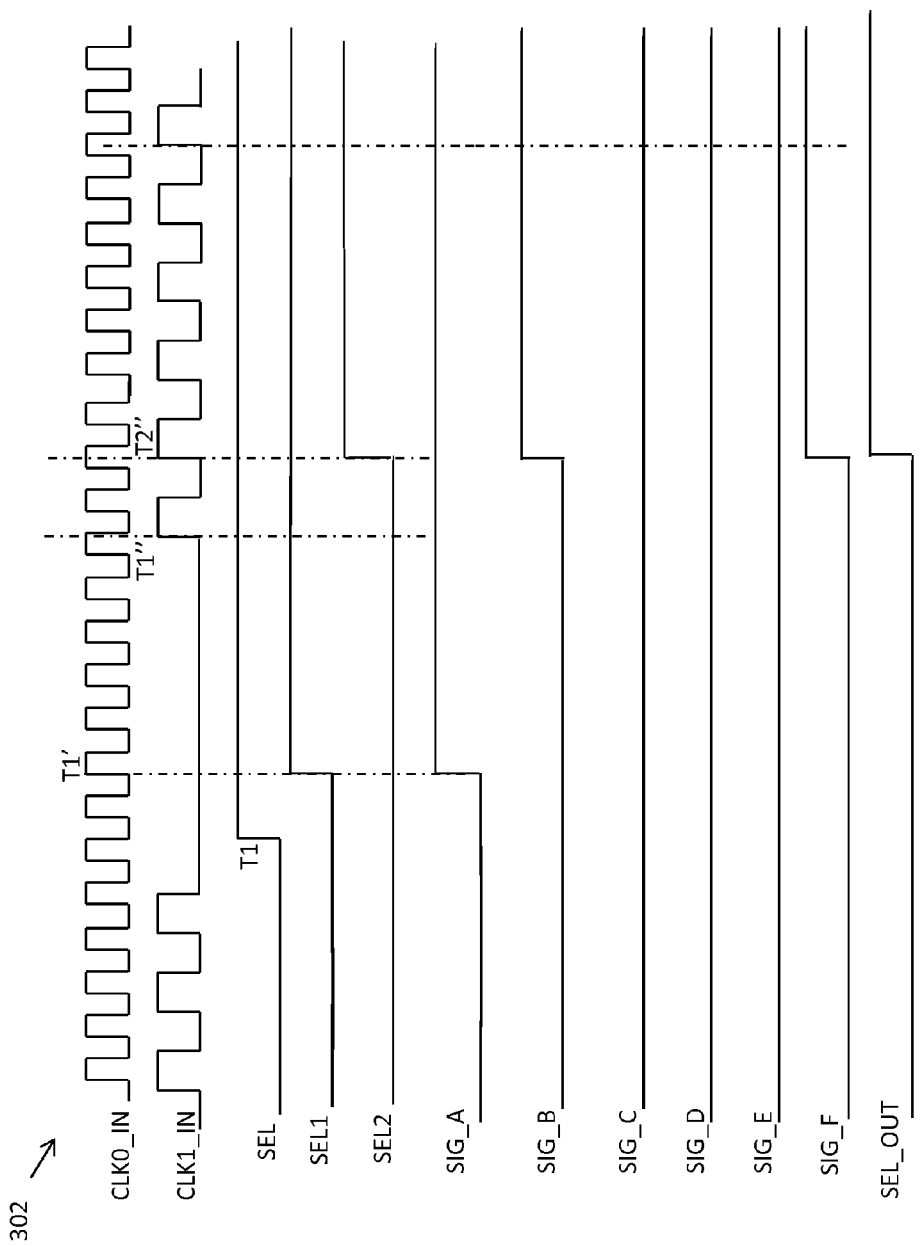

FIG. 3B shows a timing diagram 302 of the first and second clock signals CLK0_IN and CLK1_IN, the input select signal SEL, the first through sixth output signals SIG_A, SIG_B, SIG_C, SIG_D, SIG_E, and SIG_F, and the output select signal SEL_OUT, when the second clock signal CLK1_IN is erroneous and intermittently available. Initially, the input select signal SEL, the first and second select signals SEL_1 and SEL_2, the first through sixth output signals SIG_A, SIG_B, SIG_C, SIG_D, SIG_E and SIG_F, and the output select signal SEL_OUT are assumed to be in a logic low state.

When the input select signal SEL transitions from low to high at time T1, the first synchronizer 202 outputs the first select signal SEL_1 at time T1', and the second synchronizer 204 continues outputting the logic low second select signal SEL_2, as the second clock signal CLK1_IN is not available from T1 to T1". The first OR gate 206 and first AND gate 208 each receive the logic high first select signal SEL_1 and the logic low second select signal SEL_2, and generate the logic high first output signal SIG_A and logic low second output signal SIG_B at time T1', respectively. The output of the first and second flip-flops 224 and 230, i.e., the third and fourth output signals SIG_C and SIG_D stay in the logic low state.

As a result, the output of the second AND gate 214, i.e., the fifth output signal SIG_E, stays in the logic low state and the output of the second OR gate 216, i.e., the sixth output signal SIG_F, also stays in the logic low state at time T1'.

The mux 218 selects the sixth output signal SIG_F as the output select signal SEL_OUT at time T1. The output select signal SEL_OUT stays low even after the input select signal SEL transitions from low to high, and thus the synchronous clock mux 220 continues to select the first clock signal CLK0_IN as the output clock signal CLK_OUT (in the absence of the second clock signal CLK1_IN).

When the second clock signal CLK1_IN becomes available at time T1", and the input select signal SEL is in the logic high state, the second synchronizer 204 outputs the second select signal SEL_2 at time T2". The first OR gate 206 and first AND gate 208 each receive the logic high first and second select signals SEL_1 and SEL_2, and generate the logic high first and second output signals SIG_A and SIG_B at time T2". The outputs of the first and second flip-flops 224 and 230, i.e., the third and fourth output signals SIG_C and SIG_D, stay in the logic low state. As a result, the output of the second AND gate 214, i.e., the fifth output signal SIG_E, stays low, however the output of the second OR gate 216, i.e., the sixth output signal SIG_F, transitions from low to high as soon as the second output signal SIG_B transitions from low to high at time T2". The output select signal SEL_OUT transitions from low to high at time T2", which causes the synchronous clock mux 220 to select the second clock signal CLK1_IN as the output clock signal CLK_OUT at time T2".

Figure 3C:
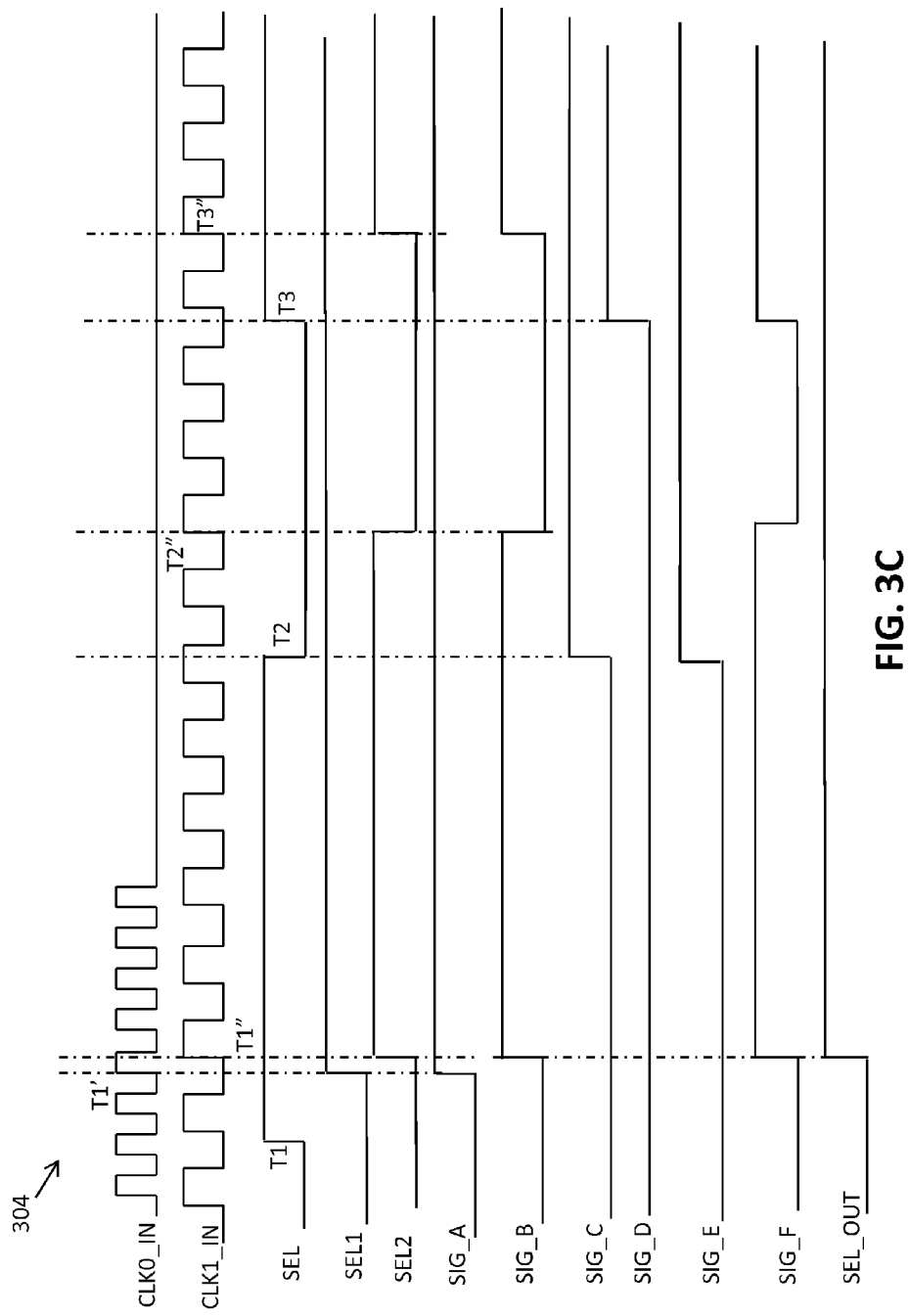

FIG. 3C is a timing diagram 304 of the first and second clock signals CLK0_IN and CLK1_IN, the input select signal SEL, and first through sixth output signals SIG_A, SIG_B, SIG_C, SIG_D, SIG_E, and SIG_F and the output select signal SEL_OUT, when the first clock signal CLK0_IN is erroneous and only intermittently available. Initially, the input select signal SEL, the first and second select signals SEL_1 and SEL_2, the first through sixth output signals SIG_A, SIG_B, SIG_C, SIG_D, SIG_E and SIG_F, and the output select signal SEL_OUT are assumed to be in a logic low state.

When the input select signal SEL transitions from low to high at time T1, the first and second synchronizers 202 and 204 each receive the input select signal SEL and generate the first and second select signals SEL_1 and SEL_2 at times T1' and T1" respectively. The first OR gate 206 and first AND gate 208 each receive the logic high first and second select signals SEL_1 and SEL_2 and generate the logic high first and second output signals SIG_A and SIG_B at times T1' and T1" respectively. The output of the first flip-flop 224, i.e., the third output signal SIG_C, stays low and the output of the second flip-flop 230, i.e., the fourth output signal SIG_D, stays low as the first output signal SIG_A is low at time T1. As a result, the output of the second AND gate 214, i.e., the fifth output signal SIG_E, stays low and the output of the second OR gate 216, i.e., the sixth output signal SIG_F, transitions from low to high as soon as the second output signal SIG_B transitions from low to high at time T1". The mux 218 selects the sixth output signal SIG_F as the output select signal SEL_OUT at time T1. The output select signal SEL_OUT transitions from low to high at time T1", and the synchronous clock mux 220 selects the second clock signal CLK1_IN as the output clock signal CLK_OUT at time T1".

When the input select signal SEL transitions from high to low at time T2, the first synchronizer 202 continue outputting the logic high first select signal SEL_1 because the first clock signal CLK0_IN is unavailable at time T2, and the second synchronizer 204 outputs the second select signal SEL_2 at time T2". The first OR gate 206 and first AND gate 208 each receive the logic high first select signal SEL_1 and logic low second select signal SEL_2, and generate the logic high first output signal SIG_A and logic low second output signal SIG_B, at time T2", respectively. The output of the first flip-flop 224, i.e., the third output signal SIG_C, transitions from low to high at time T2, and the output of the second flip-flop 230 i.e., the fourth output signal SIG_D, stays low. As a result, the output of the second AND gate 214, i.e., the fifth output signal SIG_E, transitions from low to high at time T2, and the output of the second OR gate 216 i.e., the sixth output signal SIG_F, transitions from high to low at time T2".

The mux 218 selects the fifth output signal SIG_E as the output select signal SEL_OUT at time T2. From time T2 onwards, the output select signal SEL_OUT is held high because the fifth output signal SIG_E is high, and hence, the synchronous clock mux 220 continues outputting the second clock signal CLK1_IN as the output clock signal CLK_OUT (in the absence of the first clock signal CLK0_IN).

When the input select signal SEL again transitions from low to high at time T3, the first synchronizer 202 continues outputting the logic high first select signal SEL_1 because the first clock signal CLK0_IN is unavailable, and the second synchronizer 204 outputs the input select signal SEL as the second select signal SEL_2 at time T3". The first OR gate 206 and first AND gate 208 each receive the logic high first and second select signals SEL_1 and SEL_2 and generate the logic high first and second output signals SIG_A and SIG_B at time T3", respectively. The output of the first flip-flop 224, i.e., the third output signal SIG_C stays, high, and the output of the second flip-flop 230 i.e., the fourth output signal SIG_D, transitions from low to high at time T3. As a result, the output of the second AND gate 214, i.e., the fifth output signal SIG_E, stays in the logic high state, and the output of the second OR gate 216 i.e., the sixth output signal SIG_F, transitions from low to high at time T3.

The mux 218 selects the sixth output signal SIG_F as the output select signal SEL_OUT at time T3. The output select signal SEL_OUT is in the logic high state from time T3 onwards because the sixth output signal SIG_F is high, and hence, the synchronous clock mux 220 continues to select the second clock signal CLK1_IN as the output clock signal CLK_OUT (in the absence of the first clock signal CLK0_IN).

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While particular embodiments of the present invention have been shown and described, it will be recognized to those skilled in the art that, based upon the teachings herein, further changes and modifications may be made without departing from this invention and its broader aspects. For example, where signals are described as low active, it is understood that high active signals could be used and vice-versa. Thus, the appended claims are to encompass within their scope all such changes and modifications as are within the true spirit and scope of this invention.

The invention claimed is:
1. A synchronous clock multiplexer circuit, comprising:
a first flip-flop having an input terminal for receiving an input select signal and a clock terminal for receiving a first clock signal;

a second flip-flop having an input terminal for receiving the input select signal and a clock terminal for receiving a second clock signal;

a first OR gate having a first input terminal connected to an output terminal of the first flip-flop, a second input terminal connected to an output terminal of the second flip-flop, and an output terminal for generating a first output signal;

a first AND gate having a first input terminal connected to the output terminal of the first flip-flop, a second input terminal connected to the output terminal of the second flip-flop, and an output terminal for generating a second output signal;

a first logic circuit for receiving the input select signal and the second output signal, and generating a third output signal;

a second logic circuit for receiving the input select signal and the first output signal, and generating a fourth output signal;

a second AND gate for receiving the first and third output signals, and generating a fifth output signal;

a second OR gate for receiving the second and fourth output signals, and generating a sixth output signal;

a multiplexer having a first input terminal connected to an output terminal of the second AND gate for receiving the fifth output signal, a second input terminal connected to an output terminal of the second OR gate for receiving the sixth output signal, a select terminal for receiving a first delayed input select signal, and an output terminal for generating an output select signal; and a synchronous clock multiplexer having a first input terminal for receiving the first clock signal, a second input terminal for receiving the second clock signal, a select terminal connected to the output terminal of the multiplexer for receiving the output select signal, and an output terminal for outputting one of the first and second clock signals.

2. The synchronous clock multiplexer circuit of claim 1, wherein the first logic circuit includes:

a third AND gate having a first input terminal for receiving an inverted version of the second output signal, and a second input terminal for receiving a second delayed input select signal; and a third flip-flop having an input terminal connected to an output of the third AND gate for receiving an inverted output of the third AND gate, and a clock terminal for receiving an inverted version of the input select signal, wherein the third flip-flop outputs the third output signal at an output terminal thereof when the input select signal transitions from a logic high state to a logic low state.

3. The synchronous clock multiplexer circuit of claim 2, wherein the second logic circuit includes:

a fourth AND gate having a first input terminal for receiving the first output signal, and an inverted second input terminal for receiving the second delayed input select signal; and a fourth flip-flop having an input terminal connected to an output of the fourth AND gate, and a clock terminal for receiving the input select signal, wherein the fourth flip-flop outputs the fourth output signal at an output terminal thereof when the input select signal transitions from a logic low state to a logic high state.

4. The synchronous clock multiplexer circuit of claim 3, further comprising a first delay element having an input terminal for receiving the input select signal and an output terminal connected to the select terminal of the multiplexer for providing the first delayed input select signal thereto.

5. The synchronous clock multiplexer circuit of claim 3, further comprising a second delay element having an input terminal for receiving the input select signal and an output terminal connected to the second input terminal of the third AND gate and the inverted second input terminal of the fourth AND gate for providing the second delayed input select signal thereto.

6. The synchronous clock multiplexer circuit of claim 1, wherein the first and second clock signals and the input select signal are asynchronous.

7. A synchronous clock multiplexer circuit, comprising:

a first flip-flop having an input terminal for receiving an input select signal and a clock terminal for receiving a first clock signal;

a second flip-flop having an input terminal for receiving the input select signal and a clock terminal for receiving a second clock signal;

a first OR gate having a first input terminal connected to an output terminal of the first flip-flop, a second input terminal connected to an output terminal of the second flip-flop, and an output terminal for generating a first output signal;

a first AND gate having a first input terminal connected to the output terminal of the first flip-flop, a second input terminal connected to the output terminal of the second flip-flop, and an output terminal for generating a second output signal;

a second AND gate having a first input terminal for receiving an inverted version of the second output signal, and a second input terminal for receiving a first delayed version of the input select signal;

a third flip-flop having an input terminal connected to an output of the second AND gate for receiving an inverted version of an output of the second AND gate, and a clock terminal for receiving an inverted version of the input select signal, wherein the third flip-flop outputs a third output signal at an output terminal thereof when the input select signal transitions from a logic high state to a logic low state;

a third AND gate for receiving the first and third output signals, and generating a fifth output signal, a fourth AND gate having a first input terminal for receiving the first output signal, and an inverted second input terminal for receiving the first delayed version of the input select signal; and a fourth flip-flop having an input terminal connected to an output terminal of the fourth AND gate, and a clock terminal that receives the input select signal, wherein the fourth flip-flop outputs a fourth output signal at an output terminal thereof when the input select signal transitions from a logic low state to a logic high state;

a second OR gate for receiving the second and fourth output signals, and generating a sixth output signal;

a multiplexer having a first input terminal connected to the third AND gate for receiving the fifth output signal, a second input terminal connected to the second OR gate for receiving the sixth output signal, a select terminal for receiving a second delayed version of the input select signal, and an output terminal for generating an output select signal; and a synchronous clock multiplexer having a first input terminal for receiving the first clock signal, a second input terminal for receiving the second clock signal, a select terminal connected to the output terminal of the multiplexer for receiving the output select signal, and an output terminal for outputting one of the first and second clock signals.

8. The synchronous clock multiplexer circuit of claim 7, further comprising a first delay element having an input terminal for receiving the input select signal and an output terminal connected to the second input terminal of the second AND gate and the inverted second input terminal of the fourth AND gate for providing the first delayed version of the input select signal thereto.

9. The synchronous clock multiplexer circuit of claim 7, further comprising a second delay element having an input terminal for receiving the input select signal and an output terminal connected to the select terminal of the multiplexer for providing the second delayed version of the input select signal thereto.

10. The synchronous clock multiplexer circuit of claim 7, wherein the first and second clock signals and the input select signal are asynchronous.

\* \* \* \* \*